(12) United States Patent
Graff

(10) Patent No.: US 8,664,124 B2
(45) Date of Patent: *Mar. 4, 2014

(54) METHOD FOR ETCHING ORGANIC HARDMASKS

(75) Inventor: Wesley P. Graff, Singapore (SG)

(73) Assignee: Novellus Systems, Inc., Fremont, CA (US)

( * ) Notice: Subject to any disclaimer, the term of this patent is extended or adjusted under 35 U.S.C. 154(b) by 37 days.

This patent is subject to a terminal disclaimer.

(21) Appl. No.: 13/372,363

(22) Filed: Feb. 13, 2012

(65) Prior Publication Data

US 2012/0196446 A1  Aug. 2, 2012

Related U.S. Application Data

(63) Continuation-in-part of application No. 12/142,226, filed on Jun. 19, 2008, now Pat. No. 8,114,782, which is a continuation of application No. 11/263,148, filed on Oct. 31, 2005, now Pat. No. 7,399,712.

(51) Int. Cl.
*H01L 21/302* (2006.01)

(52) U.S. Cl.
USPC ........... 438/725; 438/706; 438/710; 438/714; 438/720; 216/58; 216/67

(58) Field of Classification Search
USPC ............ 438/706, 710, 714, 720, 725; 216/58, 216/67
See application file for complete search history.

(56) References Cited

U.S. PATENT DOCUMENTS

| | | | |
|---|---|---|---|
| 3,816,976 A | 6/1974 | Stork et al. | |
| 4,209,357 A | 6/1980 | Gorin et al. | |
| 4,274,841 A | 6/1981 | Andresen et al. | |
| 4,668,261 A | 5/1987 | Chatzipetros et al. | |
| 4,673,589 A | 6/1987 | Standley | |
| 4,863,493 A | 9/1989 | Kotani et al. | |
| 4,863,760 A | 9/1989 | Schantz et al. | |
| 4,975,144 A | 12/1990 | Yamazaki et al. | |
| 5,222,549 A | 6/1993 | Ishii et al. | |
| 5,231,057 A | 7/1993 | Doki et al. | |

(Continued)

FOREIGN PATENT DOCUMENTS

| | | |
|---|---|---|
| JP | 62019539 | 1/1987 |
| SU | 382671 | 5/1973 |
| WO | 2005/048367 | 5/2005 |

OTHER PUBLICATIONS

U.S. Appl. No. 11/263,148, Office Action mailed Jun. 1, 2007.

(Continued)

*Primary Examiner* — Shamim Ahmed

(74) *Attorney, Agent, or Firm* — Weaver Austin Villeneuve & Sampson LLP

(57) ABSTRACT

A method of etching or removing an organic hardmask overlying a low dielectric constant film in a lithographic process. The method includes providing a dielectric film having thereover an organic hardmask to be removed, the dielectric film having a dielectric constant no greater than about 4.0, introducing over the organic hardmask an ionizable gas comprising a mixture of hydrogen and an oxidizing gas, and applying energy to the mixture to create a plasma of the mixture. The method further includes contacting the organic hardmask with the plasma, with the organic hardmask being at a temperature in excess of 200° C., to remove the organic hardmask without substantially harming the underlying substrate.

18 Claims, 7 Drawing Sheets

(56) References Cited

U.S. PATENT DOCUMENTS

| | | | |
|---|---|---|---|
| 5,261,250 A | 11/1993 | Missimer | |
| 5,378,316 A | 1/1995 | Franke et al. | |
| 5,470,661 A | 11/1995 | Bailey et al. | |
| 5,562,952 A | 10/1996 | Nakahigashi et al. | |
| 5,670,066 A | 9/1997 | Barnes et al. | |
| 5,792,269 A | 8/1998 | Deacon et al. | |
| 5,900,288 A | 5/1999 | Kuhman et al. | |
| 5,985,103 A | 11/1999 | Givens et al. | |
| 6,006,797 A | 12/1999 | Bulow et al. | |
| 6,030,591 A | 2/2000 | Tom et al. | |
| 6,035,803 A | 3/2000 | Robles et al. | |
| 6,041,734 A | 3/2000 | Raoux et al. | |
| 6,066,209 A | 5/2000 | Sajoto et al. | |
| 6,150,719 A | 11/2000 | Saia et al. | |
| 6,241,793 B1 | 6/2001 | Lee et al. | |
| 6,286,321 B1 | 9/2001 | Glater | |
| 6,319,299 B1 | 11/2001 | Shih et al. | |
| 6,331,480 B1 | 12/2001 | Tsai et al. | |
| 6,367,413 B1 | 4/2002 | Sill et al. | |
| 6,387,819 B1 | 5/2002 | Yu | |
| 6,458,516 B1 | 10/2002 | Ye | |
| 6,465,051 B1 | 10/2002 | Sahin et al. | |
| 6,478,924 B1 | 11/2002 | Shamouilian et al. | |
| 6,541,397 B1 | 4/2003 | Bencher | |
| 6,573,030 B1 | 6/2003 | Fairbairn et al. | |
| 6,613,434 B1 | 9/2003 | Drevillon et al. | |
| 6,617,553 B2 | 9/2003 | Ho et al. | |
| 6,635,185 B2 | 10/2003 | Demmin et al. | |
| 6,777,349 B2 | 8/2004 | Fu et al. | |
| 6,787,452 B2 | 9/2004 | Sudijono et al. | |
| 6,787,819 B2 | 9/2004 | Rhodes et al. | |
| 6,967,072 B2 | 11/2005 | Latchford et al. | |
| 7,064,078 B2 | 6/2006 | Liu et al. | |
| 7,202,176 B1 | 4/2007 | Goto et al. | |
| 7,205,228 B2 | 4/2007 | Padhi et al. | |
| 7,220,982 B2 | 5/2007 | Campbell | |
| 7,223,526 B2 | 5/2007 | Fairbairn et al. | |
| 7,235,478 B2 | 6/2007 | Geng et al. | |
| 7,288,484 B1 | 10/2007 | Goto et al. | |
| 7,314,506 B2 | 1/2008 | Vininski et al. | |
| 7,323,401 B2 | 1/2008 | Ramaswamy et al. | |
| 7,381,644 B1 | 6/2008 | Subramonium et al. | |
| 7,399,712 B1 | 7/2008 | Graff | |
| 7,495,984 B2 | 2/2009 | Kim et al. | |
| 7,576,009 B2 | 8/2009 | Lee et al. | |
| 7,803,715 B1 | 9/2010 | Haimson et al. | |
| 7,820,556 B2 | 10/2010 | Hsu et al. | |
| 7,915,166 B1 | 3/2011 | Yu et al. | |
| 7,955,990 B2 | 6/2011 | Henri et al. | |
| 7,981,777 B1 | 7/2011 | Subramonium et al. | |
| 7,981,810 B1 | 7/2011 | Subramonium et al. | |
| 8,110,493 B1 | 2/2012 | Subramonium et al. | |
| 8,114,782 B2 | 2/2012 | Graff | |
| 8,129,281 B1 | 3/2012 | Cheung et al. | |
| 8,309,473 B2 | 11/2012 | Hsu et al. | |
| 8,435,608 B1 | 5/2013 | Subramonium et al. | |
| 8,563,414 B1 | 10/2013 | Fox et al. | |
| 8,569,179 B2 | 10/2013 | Graff | |
| 2001/0021491 A1 | 9/2001 | Chen et al. | |
| 2002/0182848 A1 | 12/2002 | Joseph et al. | |
| 2003/0044532 A1 | 3/2003 | Lee et al. | |
| 2003/0106647 A1 | 6/2003 | Koshiishi et al. | |
| 2004/0016972 A1 | 1/2004 | Singh et al. | |
| 2004/0018750 A1 | 1/2004 | Sophie et al. | |
| 2004/0023502 A1 | 2/2004 | Tzou et al. | |
| 2004/0140506 A1 | 7/2004 | Singh et al. | |
| 2004/0180551 A1 | 9/2004 | Biles et al. | |
| 2004/0224504 A1 | 11/2004 | Gadgil | |
| 2004/0266195 A1 | 12/2004 | Dokumaci et al. | |
| 2005/0042889 A1 | 2/2005 | Lee et al. | |
| 2005/0054202 A1* | 3/2005 | Pan et al. | 438/694 |
| 2005/0098119 A1 | 5/2005 | Burger et al. | |
| 2005/0112506 A1 | 5/2005 | Czech et al. | |
| 2005/0129935 A1 | 6/2005 | Kunitake et al. | |
| 2005/0130404 A1 | 6/2005 | Moghadam et al. | |
| 2005/0167394 A1 | 8/2005 | Liu et al. | |
| 2005/0202683 A1 | 9/2005 | Wang et al. | |
| 2005/0260411 A1 | 11/2005 | Ravi | |
| 2006/0019486 A1 | 1/2006 | Yu et al. | |
| 2006/0091559 A1 | 5/2006 | Nguyen et al. | |
| 2006/0154086 A1 | 7/2006 | Fuller et al. | |
| 2006/0154477 A1 | 7/2006 | Geng et al. | |
| 2006/0197881 A1 | 9/2006 | Kang et al. | |
| 2006/0205223 A1 | 9/2006 | Smayling | |
| 2006/0231524 A1 | 10/2006 | Liu et al. | |
| 2007/0032054 A1 | 2/2007 | Ramaswamy et al. | |
| 2007/0048674 A1 | 3/2007 | Wells | |
| 2007/0054500 A1 | 3/2007 | Bencher | |
| 2007/0059913 A1 | 3/2007 | King et al. | |
| 2007/0077780 A1 | 4/2007 | Wang et al. | |
| 2007/0105303 A1 | 5/2007 | Busch et al. | |
| 2007/0125762 A1 | 6/2007 | Cui et al. | |
| 2007/0128538 A1 | 6/2007 | Fairbairn et al. | |
| 2007/0140029 A1 | 6/2007 | Kim et al. | |
| 2007/0166546 A1 | 7/2007 | Ichikawa et al. | |
| 2007/0166979 A1 | 7/2007 | Wang et al. | |
| 2007/0202640 A1 | 8/2007 | Al-Bayati et al. | |
| 2007/0247073 A1 | 10/2007 | Paterson et al. | |
| 2008/0073636 A1 | 3/2008 | Kim | |
| 2008/0083916 A1 | 4/2008 | Kim | |
| 2008/0128907 A1 | 6/2008 | Yang et al. | |
| 2008/0200003 A1 | 8/2008 | Hong et al. | |
| 2008/0242912 A1 | 10/2008 | Letessier et al. | |
| 2008/0254639 A1 | 10/2008 | Graff | |
| 2008/0254641 A1 | 10/2008 | Kobayashi et al. | |
| 2008/0264803 A1 | 10/2008 | Agrawal | |
| 2009/0182180 A1 | 7/2009 | Huang et al. | |
| 2009/0305516 A1 | 12/2009 | Hsu et al. | |
| 2010/0151691 A1 | 6/2010 | Henri et al. | |
| 2010/0297853 A1 | 11/2010 | Hsu et al. | |
| 2012/0149207 A1 | 6/2012 | Graff | |

OTHER PUBLICATIONS

U.S. Appl. No. 11/263,148, Office Action mailed Oct. 24, 2007.
U.S. Appl. No. 11/263,148, Notice of Allowance mailed Mar. 18, 2008.
U.S. Appl. No. 12/142,226, Office Action mailed May 2, 2011.
U.S. Appl. No. 12/142,226, Notice of Allowance mailed Oct. 13, 2011.
U.S. Appl. No. 13/371,184, "Method for etching organic hardmasks," Wesley P. Graff, filed Feb. 10, 2012.
JP patent publication No. 08-152262, published Jun. 11, 1196, machine translation.
FR patent publication No. 2853313, published Oct. 8, 2004, machine translation.
U.S. Appl. No. 13/160,399, filed Jun. 14, 2011, entitled "Methods of Depositing Highly Selective Transparent Ashable Hardmask Films".
U.S. Appl. No. 11/612,382, filed Dec. 18, 2006, entitled "Methods of Improving Ashable Hardmask Adhesion to Metal layers".
U.S. Appl. No. 13/032,392, filed Feb. 22, 2011, entitled "Improved Diffusion Barrier and Etch Stop Films".
U.S. Appl. No. 11/849,208, filed Aug. 31, 2007, entitled "Methods and Apparatus for Plasma-Based Deposition".
U.S. Appl. No. 13/974,808, filed Aug. 23, 2013, entitled "Methods and Apparatus for Plasma-Based Deposition".
U.S. Appl. No. 13/856,364, filed Apr. 3, 2013, entitled "Methods of Depositing Smooth and Conformal Ashable Hard Mask Films".
US Notice of Allowance, dated Oct. 4, 2006, issued in U.S. Appl. No. 11/318,269.
US Office Action, dated Dec. 14, 2006, issued in U.S. Appl. No. 11/318,269.
US Notice of Allowance, dated May 7, 2007, issued in U.S. Appl. No. 11/318,269.
US Office Action, dated Aug. 27, 2007, issued in U.S. Appl. No. 11/318,269.
US Notice of Allowance, dated Jan. 7, 2008, issued in U.S. Appl. No. 11/318,269.
US Office Action, dated Nov. 22, 2010, issued in U.S. Appl. No. 12/048,967.

(56) References Cited

OTHER PUBLICATIONS

US Office Action, dated Apr. 18, 2011, issued in U.S. Appl. No. 12/048,967.
US Notice of Allowance, dated Oct. 7, 2011, issued in U.S. Appl. No. 12/048,967.
US Office Action dated, Dec. 27, 2007, issued in U.S. Appl. No. 11/449,983.
US Final Office Action, dated Jul. 9, 2008, issued in U.S. Appl. No. 11/449,983.
US Office Action, dated Jan. 5, 2009, issued in U.S. Appl. No. 11/449,983.
US Final Office Action, dated Sep. 15, 2009, issued in U.S. Appl. No. 11/449,983.
US Office Action, dated Jun. 21, 2010, issued in U.S. Appl. No. 11/449,983.
US Final Office Action, dated Dec. 30, 2010, issued in U.S. Appl. No. 11/449,983.
US Notice of Allowance, dated Mar. 16, 2011, issued in U.S. Appl. No. 11/449,983.
US Office Action, dated Jun. 1, 2007, issued in U.S. Appl. No. 11/612,382.
US Office Action, dated Oct. 9, 2007, issued in U.S. Appl. No. 11/612,382.
US Final Office Action, dated May 13, 2008, issued in U.S. Appl. No. 11/612,382.
US Office Action, dated Aug. 19, 2008, issued in U.S. Appl. No. 11/612,382.
US Final Office Action, dated Feb. 24, 2009, issued in U.S. Appl. No. 11/612,382.
US Final Office Action, dated May 12, 2009, issued in U.S. Appl. No. 11/612,382.
US Final Office Action, dated Dec. 9, 2009, issued in U.S. Appl. No. 11/612,382.
US Office Action, dated Mar. 26, 2010, issued in U.S. Appl. No. 11/612,382.
US Office Action dated Nov. 20, 2009, issued in U.S. Appl. No. 11/710,652.
US Final Office Action dated Apr. 15, 2010, issued in U.S. Appl. No. 11/710,652.
US Office Action dated Aug. 5, 2010, issued in U.S. Appl. No. 11/710,652.
US Notice of Allowance dated Nov. 24, 2010, issued in U.S. Appl. No. 11/710,652.
US Office Action dated Jul. 9, 2013, issued in U.S. Appl. No. 13/032,392.
US Office Action, dated Jan. 5, 2009, issued in U.S. Appl. No. 11/710,377.
US Office Action, dated Aug. 19, 2009, issued in U.S. Appl. No. 11/710,377.
US Office Action, dated Mar. 31, 2010, issued in U.S. Appl. No. 11/710,377.
US Notice of Allowance, dated Mar. 22, 2011, issued in U.S. Appl. No. 11/710,377.
US Office Action, dated Sep. 3, 2010, issued in U.S. Appl. No. 11/849,208.
US Final Office Action, dated Apr. 12, 2011, issued in U.S. Appl. No. 11/849,208.
US Final Office Action, dated Sep. 14, 2012, issued in U.S. Appl. No. 11/849,208.
US Final Office Action, dated Apr. 24, 2013, issued in U.S. Appl. No. 11/849,208.
US Office Action, dated Oct. 19, 2011, issued in U.S. Appl. No. 12/163,670.
US Office Action, dated Feb. 14, 2012, issued in U.S. Appl. No. 12/163,670.
US Office Action, dated Jul. 6, 2012, issued in U.S. Appl. No. 12/163,670.
US Final Office Action dated Oct. 18, 2012, issued in U.S. Appl. No. 12/163,670.
US Notice of Allowance dated Jan. 3, 2013, issued in U.S. Appl. No. 12/163,670.
US Notice of Allowance, dated Nov. 2, 2010, issued in U.S. Appl. No. 12/334,220.
US Supplemental Notice of Allowance, dated Feb. 8, 2011, issued in U.S. Appl. No. 12/334,220.
US Office Action, dated Aug. 19, 2009, issued in U.S. Appl. No. 12/133,223.
US Final Office Action, dated Dec. 21, 2009, issued in U.S. Appl. No. 12/133,223.
US Notice of Allowance, dated Mar. 2, 2010, issued in U.S. Appl. No. 12/133,223.
US Office Action, dated Nov. 9, 2011, issued in U.S. Appl. No. 12/786,842.
US Final Office Action, dated Apr. 19, 2012, issued in U.S. Appl. No. 12/786,842.
US Notice of Allowance, dated Jul. 20, 2012, issued in U.S. Appl. No. 12/786,842.
US Office Action, dated Aug. 10, 2012, issued in U.S. Appl. No. 12/766,721.
US Final Office Action, dated Mar. 14, 2013, issued in U.S. Appl. No. 12/766,721.
US Notice of Allowance, dated Jun. 28, 2013, issued in U.S. Appl. No. 12/766,721.
US Office Action, dated Feb. 15, 2013, issued in U.S. Appl. No. 13/371,184.
US Notice of Allowance, dated Jul. 1, 2013, issued in U.S. Appl. No. 13/371,184.
Korean Office Action, dated Jun. 1, 2010, issued in Application No. 2009/0048358.
Callegari et al. (1993) "Optical properties of hydrogenated amorphous-carbon film for attenuated phase-shift mask applications," *J. Vac. Sci. Technol. B* 11(6), pp. 2697-2699.
Grill, A. (1999) "Diamond-like carbon: state of the art," *Diamond and Related Materials* 8,pp. 428-434.
Grill, A. (1999) "Plasma-deposited diamondlike carbon and related materials," IBM Journal of Research and Development, vol. 43, 1/2, http://research.ibm.com/journal/rd/431/grill.html.,14 pp.
Grill, et al. (1990) "Diamondlike carbon films by rf plasma-assisted chemical vapor deposition from acetylene," *IBM J. Res. Develop.*, 34(6):849-857.
Holmes et al. (1987) "Trimethylsilylacetylene", *Organic Syntheses, Coll.* vol. 8, p. 606; vol. 65, p. 61.
Ikeda et al. (1992) "Top-PECVD: A New Conformal Plasma Enhanced CVD Technology using TEOS, Ozone and Pulse-modulated RF Plasma," *IEEE*, pp. 11.2.1-11.2.4.
Jacobsohn et al. (1998) "Hydrogenated Carbon-Nitrogen Films Obtained by PECVD Using Acetylyne and Nitrogen as Precursor Gases," Mat. Res. Soc. Symp. Proc., 498: 283-288.
Kragler et al. (1995) "Scanning tunneling microscopy based lithography employing amorphous hydrogenated carbon as a high resolution resist mask," *Appl. Phys. Lett.* 67 (8), pp. 1163-1165.
Kreupl, Franz et al. (2008) "Carbon-Based Resistive Memory," presented at IEDM, submitted Jun. 26, 2008; accepted Aug. 4, 2008, 4 pages.
Lemaire, P.J., Walker, K.L., Kranz, K.S., Huff, R.G. and DiMarcello, F.V. "Diffusion of Hydrogen Through Hermetic Carbon Films on Silica Fibers," AT&T Bell Laboratories, 600 Mountain Avenue, Murray Hill, NJ 07974. *Mat. Res. Soc. Symp. Proc.*, 172:85-96 © 1990 Materials Research Society.
Muhl et al. (1999) "A Review of the Preparation of Carbon Nitride Films," Diamond and Related Materials, 8: 1809-1830.
Ong, Soon-Eng et al. (2007) "Temperature effect on bonding structures of amorphous carbon containing more than 30at.% silicon," *Diamond & Related Materials*, 16:1823-1827.
van de Ven et al. (1990) "Advantages of Dual Frequency PECVD for Deposition of ILD and Passivation Films," VLSI Multilevel Interconnection Conference Proceedings, Seventh International IEEE, 194-201.
Voronkin et al. (1994) "Structure and mechanical properties of a-C:H films deposited onto polymer substrates: Diamond and Related Materials," 4:5-9.

\* cited by examiner

METHOD FOR ETCHING ORGANIC HARDMASKS

CROSS-REFERENCE TO RELATED APPLICATIONS

This application is a continuation-in-part of prior application Ser. No. 12/142,226 filed on Jun. 19, 2008, now issued as U.S. Pat. No. 8,114,782, which is a continuation of prior application Ser. No. 11/263,148 filed on Oct. 31, 2005, now issued as U.S. Pat. No. 7,399,712, the disclosures of which are incorporated by reference herein in their entireties.

BACKGROUND OF THE INVENTION

1. Field of the Invention

The present invention relates to a cleaning process used in a semiconductor lithographic manufacturing system and, in particular, to a method for etching or removing an organic hardmask such as amorphous or spin-on carbon from a low dielectric constant film.

2. Description of Related Art

Integrated circuits (ICs) are fabricated on semiconductor wafer substrates by a lithographic process. The lithographic process allows for a mask pattern of the desired circuit or portion thereof to be transferred via radiant energy of selected wavelengths to a photoresist film on a substrate. Those segments of the absorbed aerial image, whose energy exceeds a threshold energy of chemical bonds in the photoactive component of the photoresist material, create a latent image in the resist. The latent image marks the volume of resist material that either is removed during the development process (in the case of positive photoresist) or remains after development (in the case of negative photoresist) to create a three-dimensional pattern in the resist film. In subsequent processing, the resulting resist film pattern is used as an etch mask to remove underlying substrates from the areas of the patterned openings in the resist layer.

Damascene processing techniques are often used in integrated circuit manufacturing, and involve forming inlaid metal conductors in trenches and vias in a dielectric layer. Openings in a hardmask layer are used to etch the desired portions of the dielectric layer to form the trenches and vias. The hardmask layer openings are themselves formed by etching through openings formed in an overlying resist layer. Hardmasks in damascene process can be made from an organic layer, such as a-carbon or alpha-carbon.

The move from 248 nm to 193 nm wavelength lithography has increased the complexity of the masking integration, often requiring a multilayer stack to be deposited on top of the layer to be etched. An example of this is a three layer stack of an amorphous carbon hardmask layer covered by a SiON anti-reflective coating (ARC) layer on which conventional resist can be spun and processed. After the resist is developed, a fluorine dry etch transfers the pattern to the SiON layer. The resist is stripped in conjunction with an oxygen based etch process to remove a-carbon in the hardmask layer from the openings in the SiON layer. A dielectric etch process then transfers the pattern from the a-carbon hardmask into an underlying dielectric layer used in a dual damascene approach. Following the etching of the dielectric layer, the a-carbon hardmask layer must be removed prior to forming Cu or other metal interconnects in the backend of the wafer process flow.

Sudijono et al. U.S. Pat. No. 6,787,452 discloses a method of controlling a critical dimension during a photoresist patterning process which can be applied to forming vias and trenches in a dual damascene structure. An amorphous carbon ARC is deposited on a substrate by a plasma enhanced chemical vapor deposition (PECVD) method. The alpha-carbon layer provides a high etch selectivity relative to oxide and is disclosed as being readily removed by a plasma ashing step using oxygen. Ye et al U.S. Pat. No. 6,458,516 teaches a method of removing a polymeric, organic masking layer using a hydrogen/nitrogen-based plasma.

Low dielectric constant (low-k) materials, i.e., those having a dielectric constant generally below about 2.7 to 3.0, have been used in damascene processes as inter-metal and/or inter-layer dielectrics between conductive interconnects employed to reduce the delay in signal propagation due to capacitive effects. The lower the dielectric constant of the dielectric material, the lower the capacitance of the dielectric and the lower the RC delay of the integrated circuit. Typically, low-k dielectrics are silicon-oxide based materials with some amount of incorporated carbon, commonly referred to as carbon doped oxide (CDO). An example of a CDO is CORAL brand carbon-doped oxides, from Novellus Systems, Inc. of San Jose, Calif. It has been found that highly oxidizing conditions are generally unsuitable for use on low-k materials. When exposed to an $O_2$ plasma, the oxygen scavenges or removes carbon from the low-k materials. In many of these materials such as CDOs, the presence of carbon is instrumental in providing a low dielectric constant. Hence, to the extent that the oxygen removes carbon from these materials, it effectively increases the dielectric constant. As processes used to fabricate integrated circuits move toward smaller and smaller dimensions and requires the use of dielectric materials having lower and lower dielectric constants, it has been found that the conventional strip plasma conditions are not suitable.

Consequently, a need exists in the art for the development of an alternative process that effectively removes organic hardmask layers such as amorphous carbon, and that does not remove excessive amounts of the low-k dielectric materials or otherwise materially alter the properties of low-k dielectric materials.

SUMMARY OF THE INVENTION

According to one aspect of the present invention, an improved method of etching and/or removing an organic hardmask from wafer substrates in a lithographic process is provided.

According to another aspect of the present invention, a method of removing an organic hardmask without damaging an underlying dielectric layer is provided.

According to another aspect of the present invention, a method of removing an organic hardmask layer without damaging an underlying low-k dielectric layer is provided.

According to another aspect of the present invention, a method of removing an organic hardmask layer without affecting critical dimension features etched into an underlying low-k dielectric layer is provided.

The above and other aspects, which will be apparent to those skilled in art from the disclosure herein, are achieved in the present invention which is directed to a method of etching or removing an organic hardmask, such as an amorphous carbon organic hardmask, comprising providing a substrate having thereover an organic hardmask to be removed, introducing over the substrate and organic hardmask an ionizable gas comprising a mixture of hydrogen and an oxidizing gas, and applying energy to the mixture to create a plasma of the mixture. The method then includes contacting the organic hardmask with the plasma, wherein the substrate and organic hardmask are at a temperature in excess of 200° C., to remove at least a portion of the organic hardmask and exposing the substrate without substantially harming the underlying substrate.

Preferably, the organic hardmask is completely removed from the underlying substrate.

In another aspect, the present invention is directed to a method of removing an organic hardmask overlying a low dielectric constant film in a lithographic process comprising providing a dielectric film having thereover an organic hardmask to be removed, the dielectric film having, a dielectric constant no greater than about 4.0, and contacting the organic hardmask with plasma comprising an ionized mixture of hydrogen and an oxidizing gas, wherein the dielectric film and organic hardmask are at a temperature in excess of 200° C., to remove the organic hardmask without substantially affecting the underlying dielectric film.

In a further aspect, the present invention is directed to a method of etching or removing an organic hardmask overlying a low dielectric constant film in a lithographic process comprising providing a dielectric film having thereover an organic hardmask to be removed, the dielectric film having a dielectric constant no greater than about 4.0, introducing over the organic hardmask an ionizable gas comprising a mixture of hydrogen and an oxidizing gas, and applying energy to the mixture to create a plasma of the mixture. The method further includes contacting the organic hardmask with the plasma, wherein the dielectric film and organic hardmask are at a temperature in excess of 200° C., to remove the organic hardmask without substantially harming the underlying substrate.

The organic hardmask may be chemical vapor deposited amorphous carbon and the substrate may be a dielectric film, such as a dielectric film having a dielectric value less than about 3.0, for example, a carbon-doped oxide dielectric film.

The organic hardmask may be amorphous carbon, and the dielectric film may have a dielectric constant no greater than about 2.8.

The oxidizing gas may be provided from a source of carbon dioxide. The gas mixture is preferably essentially nitrogen-free.

In other embodiments, the invention includes a wafer having a dielectric layer including a plurality of dielectric materials including a bulk low-k dielectric underlying a capping dielectric, the capping dielectric having a higher k value than the bulk low-k dielectric. In some embodiments, the bulk low-k dielectric and the capping dielectric are both low-k dielectrics. In other embodiments, the bulk low-k dielectric is a low-k dielectric and the capping dielectric is not a low-k dielectric.

In still other embodiments, the plurality of dielectric materials may include discrete bulk low-k dielectric and capping dielectric layers, or the plurality of dielectric materials may have a continuous, graded transition between the bulk low-k dielectric material and the capping dielectric material.

BRIEF DESCRIPTION OF THE DRAWINGS

The invention may best be understood by reference to the detailed description which follows taken in conjunction with the accompanying drawings in which.

DESCRIPTION OF THE PREFERRED EMBODIMENT(S)

Figure 1:
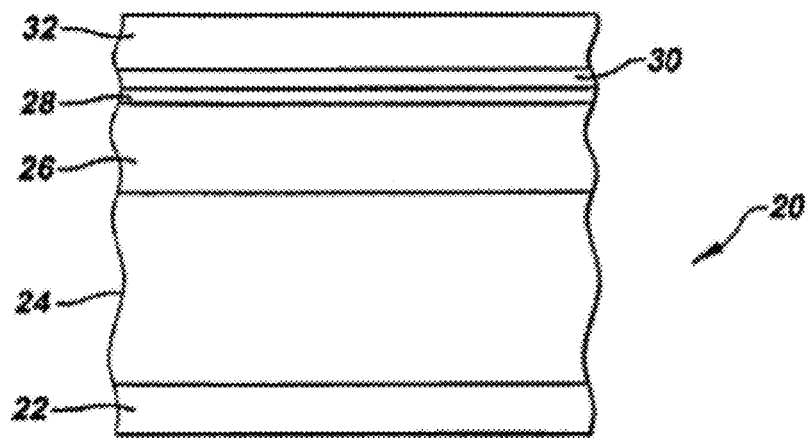
FIGS. 1 and 1A are cross-sectional elevational views of an organic hardmask, photoresist and other layers deposited on a wafer substrate over a low-k dielectric to be etched.

In describing the preferred embodiments of the present invention, reference will be made herein to the drawings in which like numerals refer to like features of the invention.

The present invention is directed to the removal of organic hardmask materials used to form ashable hardmasks (AHM), such as amorphous carbon hardmasks, known as a-carbon or alpha-carbon, or spin-on hardmasks. Such hardmasks may be formed on a substrate by chemical vapor deposition (CVD), spin-on, or other techniques. The AHM material generally is primarily composed of carbon, for example, about 50-80 weight percent, with the remainder being hydrogen and possibly trace nitrogen. Examples of starting materials used to form such films include $CH_4$ and $C_2H_2$, or more generally $C_xH_y$, wherein x=2 to 4 and y=2 to 10.

While the method of the present invention may be used to efficiently and effectively to remove organic hardmask materials from low-k dielectric films, it is not limited to low-k dielectric films, or even to dielectrics. The invention is also not limited to any particular category of low-k dielectrics. For instance, the present invention may be effectively used with dielectrics with k values less than 4.0 (also known as first generation low-k dielectrics), dielectrics with k values less than about 2.8 (second generation low-k dielectrics) and dielectrics with k values less than about 2.0 (ultra-low-k dielectrics). The low-k dielectric may be porous or non-porous (the latter sometimes referred to as a dense low-k dielectric). Generally, dense low-k dielectrics are those having k values no greater than 2.8 and low-k porous dielectrics are those having k values no greater than 2.2. Low-k dielectrics of any suitable composition may be used, including silicon oxide based dielectrics doped with fluorine and/or carbon. Non-silicon oxide based dielectrics, such as polymeric materials, may also be used. Any suitable process may be used to deposit the low-k dielectric, including as spin-on deposit and CVD deposit techniques. In the case of forming porous dielectrics, any suitable method may be used. A typical method involves co-depositing a silicon-based backbone and an organic porogen and subsequently removing the porogen component, leaving a porous dielectric film. Other methods include sol-gel techniques. Specific examples of suitable low-k films are carbon based spin-on type films sold under the trademark SiLK by Dow Chemicals, Inc. and CVD deposited porous films sold under the trademark CORAL by Novellus Systems, Inc.

The organic hardmask is preferably etched and removed by reactive plasma etching. In general, reactive plasma etching is performed in situ in a plasma reactor in which the processing chamber promotes excitation and/or disassociation of the reactant gases by the application of RF energy with capacitively coupled electrodes disposed in the processing chamber. The plasma typically creates a highly reactive species that reacts with and etches away the unwanted deposition material present in the processing chamber. The present invention may use plasmas generated with microwave (MW), inductively coupled plasma (ICP) or in a parallel plate reactive ion etch (RIE) reactor.

The plasma reactor apparatus that may be used in practicing the present invention includes a vacuum pump for creating a vacuum in the process chamber. The apparatus of the invention also includes a process gas inlet assembly such as a pressurized gas cylinder coupled to an inlet conduit connected to a gas distribution faceplate or showerhead in. the process chamber. The semiconductor wafer substrate or other workpiece rests on a pedestal or platen, which may apply a bias to the substrate. An RF or other power supply applies electrical power between the gas distribution faceplate or showerhead and the pedestal to excite the process gas or mixture of gasses to form a plasma within the cylindrical reaction region between the faceplate and pedestal.

The ionizable process gas used in the present invention is preferably a mixture of hydrogen and an oxygen-containing or oxidizing gas such as CO or $CO_2$. The oxidizing gas preferably comprises from about 0.5 to 10 volume percent of the mixture. Preferably, the gas mixture to be ionized contains no nitrogen, to avoid causing damage to any underlying CDO dielectric layers by incorporating nitrogen into the film, which is known to create amine groups that can interact with photo resist to cause what is known as the resist poisoning effect. Sensitive resists, such as 193 nm resist, can react with amine groups which neutralize acidic compounds in the resist and prevent them from properly developing and being removed in the solvent removal step of the lithography sequence, thus leaving residual resist in undesired areas of the wafer. With added Ar or He, there may be some benefit, but it has not been characterized with the H2+CO2 plasma. Using He or Ar in a RIE etch tool could enhance the etch rate or could prove beneficial at the end of the process by sputtering off post etch polymers or other defects that are often left on the wafer surface 25. Thus, there may be some benefit with respect to leaving a clean wafer surface or a surface that has fewer submicron defects.

It is important to keep the wafer temperature above about 200° C., preferably above 250° C. and more preferably in the range of about 250-350° C., during the plasma etching. A heating element may be supplied in the process chamber for such purpose. During operation, the plasma process gas moves from one side of the vacuum chamber to the other side due to the vacuum generated on the side of the vacuum chamber opposite the side from which the ionizable process gas flows into the chamber. The plasma process gas diffuses across the surface of the wafer substrate removing the organic hardmask and carrying the volatilized material towards the vacuum pump assembly.

Figure 2:
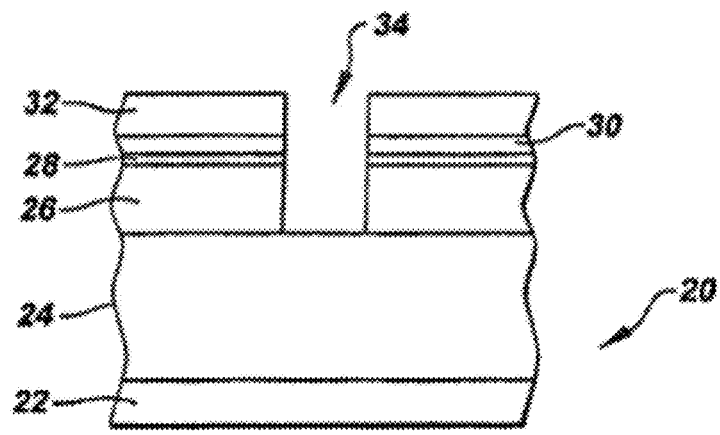
FIGS. 2 and 2A are cross-sectional elevational views of the wafer substrate of FIGS. 1 and 1A, respectively, after the photoresist, organic hardmask and other layers over the low-k dielectric have been etched.

As shown in FIG. 1, a wafer 20 includes etch stop layer 22 over which is deposited a low-k dielectric layer 24. An organic (e.g., amorphous carbon) hardmask layer 26 is deposited over the low-k dielectric layer 24. A resist layer 32, an optional organic (or spin on) antireflective coating (ARC) layer 30 and a dielectric ARC layer of SiOC (created by reacting $CO_2$ and $Si(CH_3)_4$), SiON or $Si_3N_4$ ARC layer 28 overlie the organic hardmask layer. The resist layer is exposed to a device pattern and developed to remove a volume of resist material corresponding to the pattern. As shown in FIG. 2, the opening 34 in remaining resist layer 32 is then used as a mask to etch a corresponding volume of material from the ARC layers 28, 30 and organic hardmask layer 26.

Figure 3:
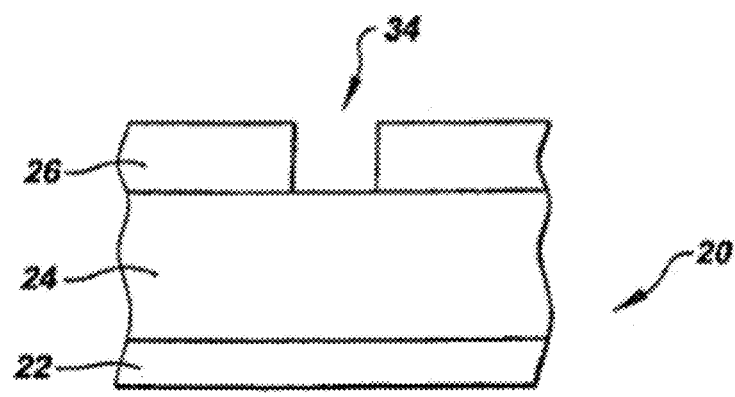
FIGS. 3 and 3A are cross-sectional elevational views of the wafer substrate of FIGS. 2 and 2A, respectively, after the layers over the etched organic hardmask layer have been removed.
Figure 4:
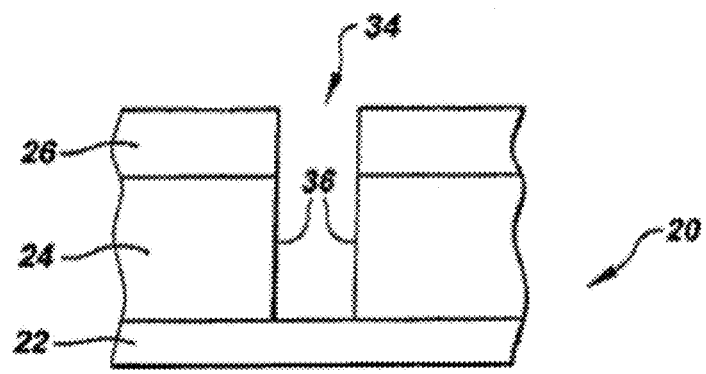
FIGS. 4 and 4A are cross-sectional elevational views of the wafer substrate of FIGS. 3 and 3A, respectively, after the low-k dielectric has been etched through the organic hardmask layer.

The resist and ARC layers are then removed to leave organic hardmask layer and etched pattern opening 34 over layer 24, as shown in FIG. 3. The resist layer and residue may be removed by processes disclosed in U.S. patent application Ser. Nos. 10/890,653, 11/011,273 and 11/128,930, the disclosures of which are hereby incorporated by reference. Typically, the wafer is typically subject to an ashing process to strip and remove the resist layer, for example by transfer to a plasma reactor and hydrogen plasma stripping of the low-k dielectric film. After stripping the resist and other overlying layers, the organic hardmask layer is then used to etch the underlying low-k dielectric layer by, for example, reactive ion etching (RIE), as shown in FIG. 4 where opening 34 is continued down into low-k layer 24 to create an opening having walls 36.

A more common method is for a wafer with the layers shown in FIG. 2 to be exposed to the RIE etch, without removing the layers 32, 30, 28. Due to the long etch time typically required by the RIE etch, the layers 32, 30, 28 will be completely removed before the etch stop layer 22 is exposed. The resulting structure is shown in FIG. 4. This is achieved by exposing the structure shown in FIG. 2 to the RIE etch, thus skipping the need for the separate resist/ARC removal step described above and in FIG. 3, and resulting in the FIG. 4 structure.

Figure 5:
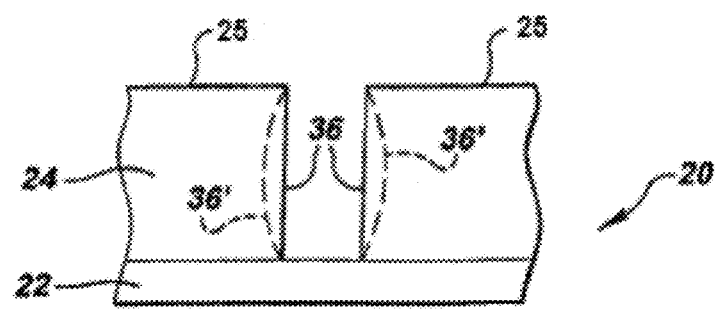
FIGS. 5 and 5A are cross-sectional elevational views of the wafer substrate of FIGS. 3 and 3A, respectively, after the organic hardmask layer has been removed by the high temperature plasma method of the present invention, without damage to the low-k dielectric.

The wafer is then subject to the high temperature plasma cleaning method of the present invention to remove the organic hardmask layer, leaving the low-k dielectric layer undamaged and ready to receive a conductive metal in opening 36. The plasma processing may be conducted in the same reactor used for the hydrogen plasma ashing process, but requires the use of a heating element to achieve the desired reaction temperature. Subsequently, as shown in FIG. 5, the surface 25 of the dielectric layer 24 is substantially free of a-carbon or other organic hardmask residue, and the dimensions of the etched via or trench 36 in the dielectric layer are unaffected and not subject to any damage such as by eroded sidewalls 36'.

In a Novellus Systems Iridia 200 mm etch tool, the wafer comprising the organic hardmask layer overlying the low-k dielectric layer is heated by heat lamps to a typical temperature of 280° C. Microwave power in the range of about 1000-3000 W, typically about 1800 W, at 2.45 GHz may be applied to a $H_2/CO_2$ gas mixture flowing at a rate of about 500-4000 sccm, typically about 1800 sccm, into the chamber maintained at a pressure in the range of 750-4000 mT, typically 1000 mT. After a processing time of between about 30 and 180 seconds, typically about 90 seconds, the organic hardmask layer is removed without substantial damage to the low-k dielectric layer.

In a Novellus Systems Gamma tool, the wafer comprising the organic hardmask layer overlying the low-k dielectric layer is heated by an electrical resistance heated platen to a typical temperature of 280° C. RF power in the range of about 500-3000 W, typically about 2000 W, at 3.56 MHz may be applied to a $H_2/CO_2$ gas mixture flowing at a rate of about 5000-40000 sccm, typically about 20000 sccm, into the chamber maintained at a pressure in the range of 750-4000 mT, typically 1100 mT. The tool contains from 4 to 6 platens, and the wafer is moved through all of the platens during the etch processing. After a total processing or plasma exposure time of between about 20 and 180 seconds, typically about 90 seconds, the organic hardmask layer is removed without substantial damage to the low-k dielectric layer.

In a Novellus Systems Iridia 300 mm Sierra etch tool having a dual power source, the wafer comprising the organic hardmask layer overlying the low-k dielectric layer is heated to a typical temperature of 280° C. Microwave power in the range of about 1000-3000 W, typically about 1800 W, at 2.45 GHz may be applied to a $H_2/CO_2$ gas mixture flowing at a rate of about 500-4000 sccm, typically about 1800 sccm, into the chamber maintained at a pressure in the range of 750-4000 mT, typically 1000 mT. The platen supporting the wafer is inside a RF plasma reaction chamber, and is coupled to the RF source which supplies power in the range of 500-2000 W, typically 1000 W, at 3.56 MHz. After a processing time of between about 30 and 180 seconds, typically about 90 seconds, the organic hardmask layer is removed without substantial damage to the low-k dielectric layer.

The gas flow rate, RF power setting, time of exposure and other parameters may be adjusted to achieve desired results for other cleaning tasks.

Thus, the present invention provides an improved method of etching and/or removing organic hardmask layers from wafer substrates in a lithographic process, particularly when removing amorphous carbon from a low-k dielectric layer. The present invention achieves such organic hardmask removal and without damaging the underlying low-k dielectric substrate.

Other Embodiments

In addition to the embodiments described with reference to FIGS. 1 to 5 above, there are other embodiments of the present invention, described below with reference to FIGS. 1A-5A, 6 and 7.

Figure 1A:
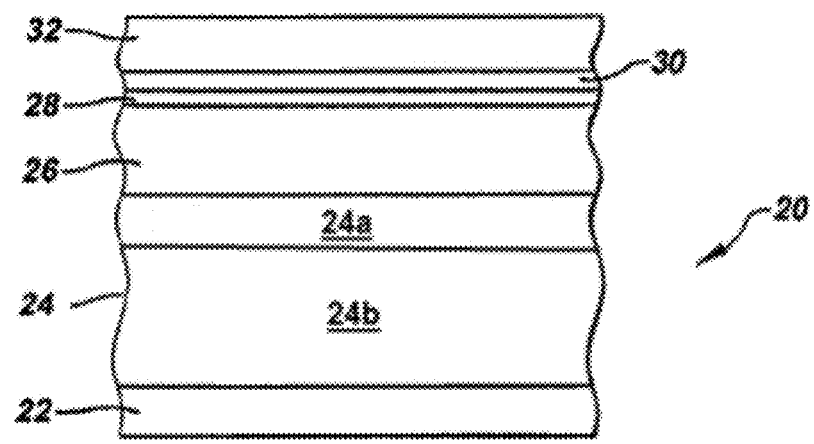

As shown in FIG. 1A, another embodiment of the invention includes a wafer 20 having an etch stop layer 22 over which is deposited a low-k dielectric layer 24. The dielectric layer 24, includes a plurality of dielectric materials including a bulk low-k dielectric 24b underlying a capping dielectric 24a, the capping dielectric 24a having a higher k value than the bulk low-k dielectric 24b. In some embodiments, the bulk low-k dielectric 24b and the capping dielectric 24a are both low-k dielectrics. In other embodiments, the bulk low-k dielectric 24b is a low-k dielectric and the capping dielectric 24a is not a low-k dielectric.

In some specific embodiments, the bulk low-k dielectric can be an ultra-low-k (ULK) dielectric, for example one having a k of about 2.2, and the capping dielectric can be a carbon-doped oxide (CDO) having a k of about 2.9.

In other specific embodiments, the bulk layer can be a carbon-doped oxide (CDO) having a k of about 2.9 and the capping layer can tetraethylorthosilicate (TEOS) having a k of about 4.0.

In still other embodiments, the plurality of dielectric materials may include discrete bulk low-k dielectric and capping dielectric layers; that is, separate, adjacent dielectric layers. Or, the plurality of dielectric materials may have a continuous, graded transition between the bulk low-k dielectric material and the capping dielectric material. Such a graded transition may be substantially uniform from one side of the dielectric layer 24 to the other. Or it may be non-uniform with a transition from one dielectric to the other over just a portion of the total thickness of the dielectric 24, for example over a thickness of less than 50%, or less than 25%, or less than 10%, or less than 5% of the total thickness of the dielectric 24.

Figure 2A:
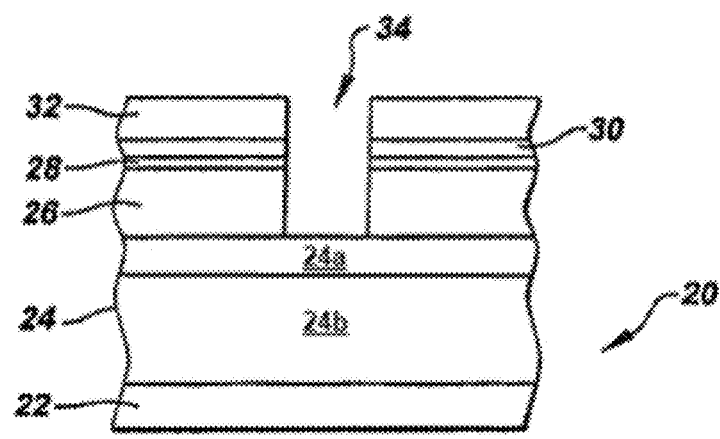

An organic carbon hardmask layer 26 is deposited over the low-k dielectric layer 24. A resist layer 32, an optional organic (or spin on) antireflective coating (ARC) layer 30 and a dielectric ARC layer of SiOC (created by reacting $CO_2$ and $Si(CH_3)_4$), SiON or $Si_3N_4$ ARC layer 28 overlie the organic hardmask layer. The resist layer is exposed to a device pattern and developed to remove a volume of resist material corresponding to the pattern. As shown in FIG. 2A, the opening 34 in remaining resist layer 32 is then used as a mask to etch a corresponding volume of material from the ARC layers 28, 30 and organic hardmask layer 26.

Figure 3A:
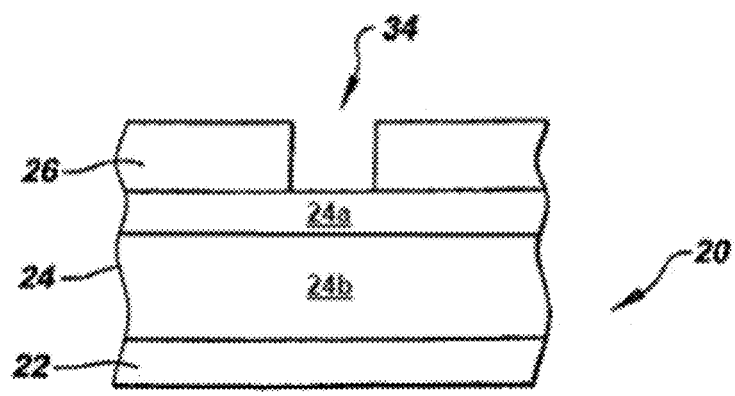
Figure 4A:
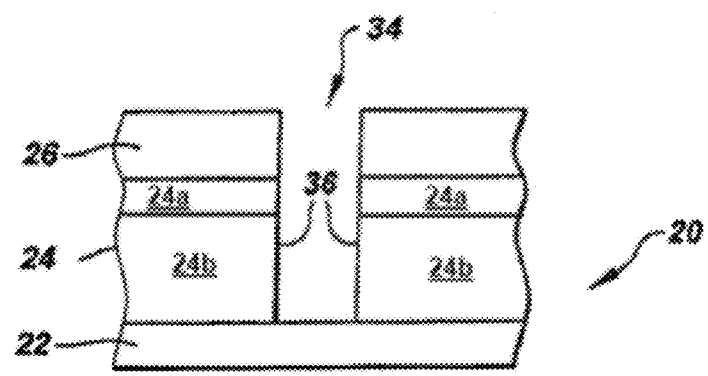

The resist and ARC layers are then removed to leave organic hardmask layer and etched pattern opening 34 over layer 24, as shown in FIG. 3A, such that the dielectric layer 24 underlying the hardmask layer 26 is exposed. The resist layer and residue may be removed by processes disclosed in U.S. patent application Ser. Nos. 10/890,653, 11/011,273 and 11/128,930, the disclosures of which are hereby incorporated by reference. Typically, the wafer is subject to an ashing process to strip and remove the resist layer, for example by transfer to a plasma reactor and hydrogen plasma stripping of the low-k dielectric film. After stripping the resist and other overlying layers, the organic hardmask layer 26 is then used to etch the underlying low-k dielectric layer 24 (24a and 24b) by, for example, reactive ion etching (RIE), as shown in FIG. 4A where opening 34 is continued down into low-k layer 24 to create an opening having walls 36, further exposing the dielectric layer 24.

A more common method is for a wafer with the layers shown in FIG. 2A to be exposed to the RIE etch, without removing the layers 32, 30, 28. Due to the long etch time typically required by the RIE etch, the layers 32, 30, 28 will be completely removed before the etch stop layer 22 is exposed. The resulting structure is shown in FIG. 4A. This is achieved by exposing the structure shown in FIG. 2A to the RIE etch, thus skipping the need for the separate resist/ARC removal step described above and in FIG. 3A, and resulting in the FIG. 4A structure.

Figure 5A:
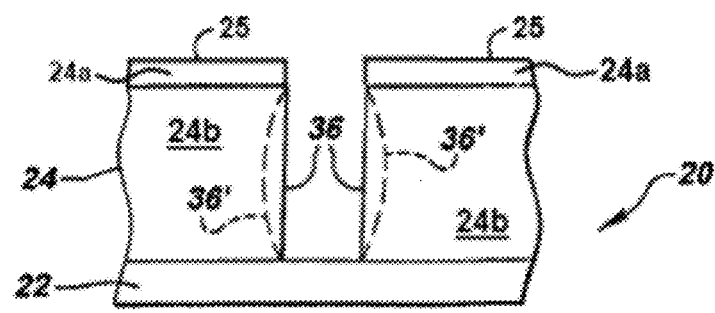

The wafer is then subject to the high temperature plasma cleaning method of the present invention to remove the organic hardmask layer, leaving the low-k dielectric layer undamaged and ready to receive a conductive metal in opening 36. In particular it is noted that the low-k dielectric exposed during the removal of the hardmask is undamaged by that removal process. The plasma processing may be conducted in the same reactor used for the hydrogen plasma ashing process, but requires the use of a heating element to achieve the desired reaction temperature. Subsequently, as shown in FIG. 5A, the surface 25 of the dielectric layer 24 is substantially free of a-carbon or other organic hardmask residue, and the dimensions of the etched via or trench 36 in the dielectric layer are unaffected and not subject to any damage such as by eroded sidewalls 36'.

Apparatus

Figure 6:
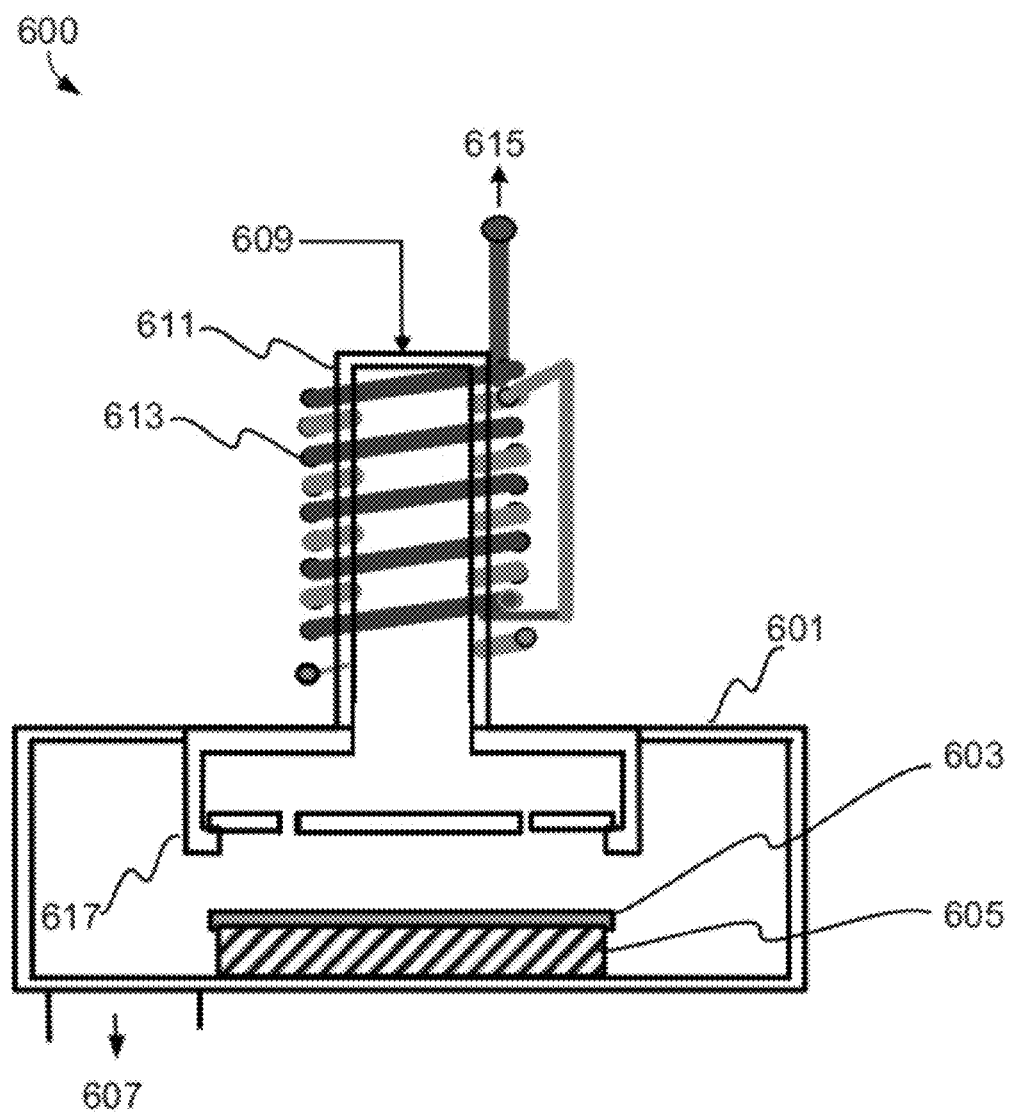
FIG. 6 is a schematic illustration showing an apparatus suitable for practicing the present invention.

Any suitable plasma reaction chamber apparatus may be used to implement the present invention, including the Gamma and Iridia tools noted above. Further in this regard, a suitable example is a Novellus Gamma™ 2130 tool which is configured with a downstream plasma setup. FIG. 6 is a schematic illustration showing aspects of a downstream plasma apparatus 600 suitable for practicing the present invention on wafers. Apparatus 600 has a plasma producing portion 611 and an exposure chamber 601 separated by a showerhead assembly 617. Inside exposure chamber 601, a wafer 603 rests on a platen (or stage) 605. Platen 605 is fitted with a heating/cooling element. In some embodiments, platen 605 is also configured for applying a bias to wafer 603. Low pressure is attained in exposure chamber 601 via vacuum pump via conduit 607. Sources of gaseous hydrogen (with or without dilution/carrier gas) and carbon dioxide (or other weak oxidizing agent) provide a flow of gas via inlet 609 into plasma producing portion 611 of the apparatus. Plasma producing portion 611 is surrounded in part by induction coils 613, which are in turn connected to a power source 615. During operation, gas mixtures are introduced into plasma producing portion 611, induction coils 613 are energized and a plasma is generated in plasma producing portion 611. Showerhead assembly 617, which has an applied voltage, terminates the flow of some ions and allows the flow of neutral species into exposure chamber 601. As mentioned, wafer 603 may be temperature controlled and/or a RF bias may be applied.

Figure 7:
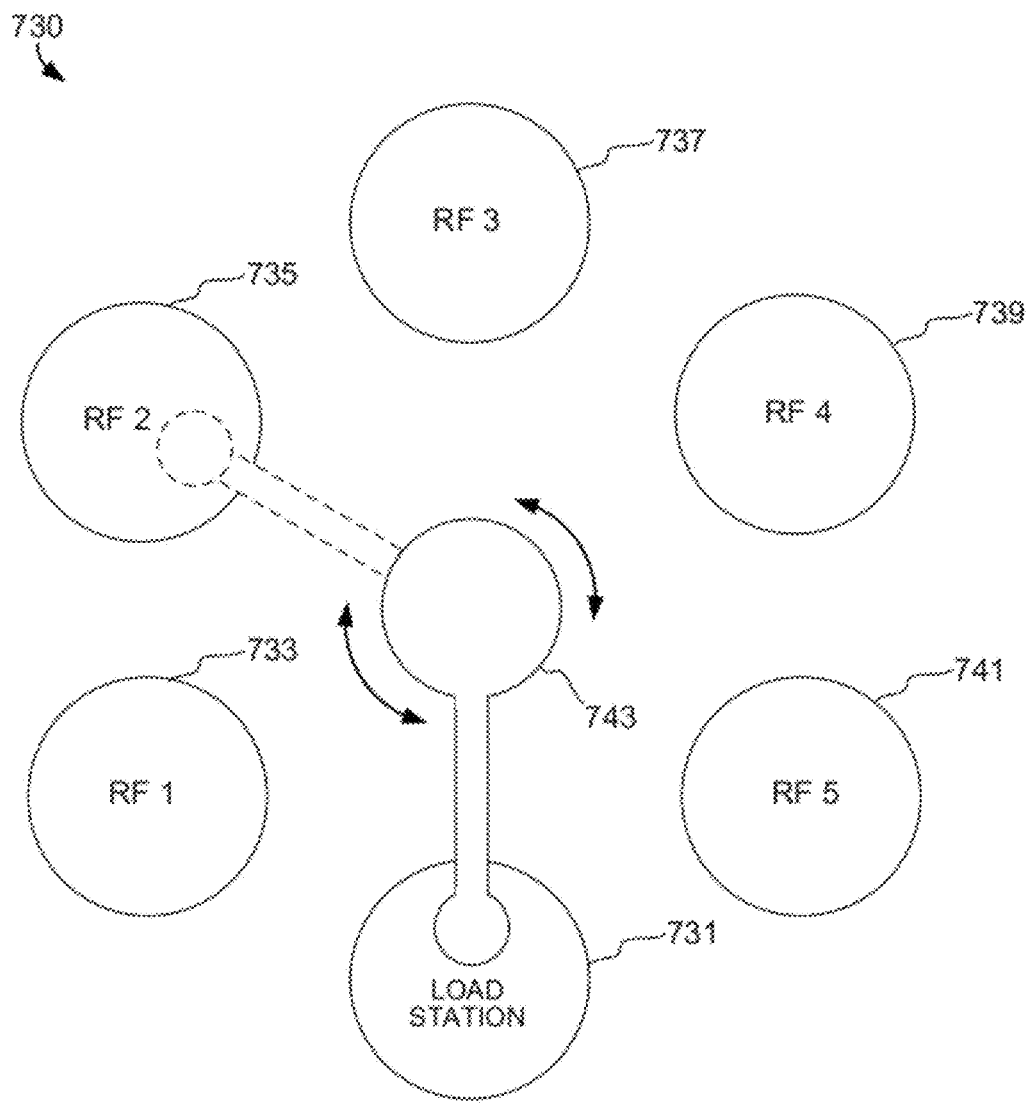
FIG. 7 is a simple block diagram showing a multi-station stripping tool suitable for practicing the present invention.

In some embodiments, the apparatus of the invention is a strip unit dedicated to stripping photoresist from wafers. Generally, such a strip unit tool will have multiple wafer process stations so that multiple wafers may be processes simultaneously. FIG. 7 is a simple block diagram showing a top-down view of a multi-station wafer strip unit tool 730 that may be used in accordance with the invention. Strip unit tool 730 has five strip stations 733, 735, 737, 739 and 741 and one load station 731. Strip unit tool 730 is configured such that each station is capable of processing one wafer and so all stations may be exposed to a common vacuum. Each of strip stations 733, 735, 737, 739 and 741 has its own RF power supply. Load station 731 is typically configured with a load-lock station attached thereto to allow the input of wafers into strip unit tool 730 without a break in vacuum. Load station 731 is also typically configured with a heat lamp to pre-heat wafers before transferring to strip stations and photoresist stripping. Strip station 741 is typically configured with a load-lock station attached thereto to allow the output of wafers from strip unit tool 730 without a break in vacuum. A robotic arm 743 transfers wafers from station to station.

During typical manufacturing mode, wafers are processed in batch mode. Batch mode processing can increase wafer through-put and is therefore commonly used in manufacturing operation. In batch mode, each wafer is transferred to, and processed in, each of stations 731, 733, 735, 737, 739 and 741. For example, a typical batch mode process will proceed as follows: A wafer is first loaded into load station 731 where it is preheated with a heat lamp. Next, robotic arm 743 transfers the wafer to strip station 733 where it is plasma processed for a time period sufficient to strip off about ⅕ of the photoresist. Robotic arm 743 then transfers the wafer to strip station 735 where it is plasma processed for a time period sufficient to strip off about another ⅕ of the remaining photoresist. This sequence is continued such that the wafer is processed at strip stations 737, 739 and 741. At strip station 741, the photoresist should be largely removed and wafer 741 is then unloaded from the strip unit tool.

Other tools suitable for implementing the present invention include GxT™ and G400™ photoresist strip tools available from Novellus Systems, Inc., a 2300 Flex™ etch tool available for Lam Research, a Telius™ etch tool available from Tokyo Electron Limited, or a Producer™ etch tool available from Applied Materials.

It should be generally understood that the apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a substrate, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or substrate by using a dry or plasma-assisted etching tool; and (6) removing the resist using a tool such as an RF or microwave plasma resist stripper.

Another aspect of the invention is an apparatus configured to accomplish the methods described herein. A suitable apparatus includes hardware for accomplishing the process operations and a system controller having instructions for controlling process operations in accordance with the present invention. A suitable plasma reaction chamber apparatus, such as the Gamma and Iridia tools or others noted above may be adapted in this way. The system controller will typically include one or more memory devices and one or more processors configured to execute the instructions so that the apparatus will perform a method in accordance with the present invention. Machine-readable media containing instructions for controlling process operations in accordance with the present invention may be coupled to the system controller.

While the present invention has been particularly described, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of etching or removing an organic hardmask comprising:
   providing a semiconductor wafer substrate comprising an exposed low-k dielectric and having thereover an organic hardmask to be removed;
   introducing over the substrate and organic hardmask an ionizable gas comprising a mixture of hydrogen and an oxidizing gas;
   applying energy to the mixture to create a plasma of the mixture; and
   contacting the organic hardmask with the plasma, wherein the substrate and organic hardmask are at a temperature in excess of 200° C., to remove at least a portion of the organic hardmask and exposing the substrate without substantially harming the underlying substrate.

2. The method of claim 1, wherein the organic hardmask comprises chemical vapor deposited amorphous carbon.

3. The method of claim 1, wherein the organic hardmask comprises a spin-on carbon film.

4. The method of claim 1, wherein the substrate comprises a dielectric film having a dielectric value (k) less than about 2.5.

5. The method of claim 1, wherein the substrate comprises a dielectric film having a dielectric value (k) less than about 3.0.

6. The method of claim 5, wherein the dielectric film comprises a single carbon-doped oxide dielectric material having a dielectric value (k) less than about 3.0.

7. The method of claim 4, wherein the dielectric film comprises a plurality of dielectric materials.

8. The method of claim 7, wherein the plurality of dielectric materials comprise a bulk low-k dielectric underlying a capping dielectric, the capping dielectric having a higher k value than the bulk low-k dielectric.

9. The method of claim 8, wherein both the bulk low-k dielectric and the capping dielectric are low-k dielectrics.

10. The method of claim 8, wherein the bulk low-k dielectric is a low-k dielectric and the capping dielectric is not a low-k dielectric.

11. The method of claim 8, wherein the bulk low-k dielectric is an ultra-low-k (ULK) dielectric having a k of about 2.2 and the capping dielectric is a carbon-doped oxide (CDO) having a k of about 2.9.

12. The method of claim 8, wherein the bulk layer is a carbon-doped oxide (CDO) having a k of about 2.9 and the capping layer is tetraethylorthosilicate (TEOS) having a k of about 4.0.

13. The method of claim 8, wherein the plurality of dielectric materials comprise discrete bulk low-k dielectric and capping dielectric layers.

14. The method of claim 8, wherein the plurality of dielectric materials comprise a graded transition between the bulk low-k dielectric material and the capping dielectric material.

15. The method of claim 1, wherein the gas mixture is nitrogen-free.

16. The method of claim 1, wherein the organic hardmask is completely removed from the underlying substrate.

17. The method of claim 1, further comprising the steps of:
applying photoresist to the substrate;
exposing the photoresist to light;
patterning the resist and transferring the pattern to the substrate; and,
selectively removing the photoresist from the substrate.

18. The method of claim 8, further comprising the steps of:
applying photoresist to the substrate;
exposing the photoresist to light;
patterning the resist and transferring the pattern to the substrate; and,
selectively removing the photoresist from the substrate.

* * * * *